(12) United States Patent
Klöppel et al.

(10) Patent No.: US 7,285,342 B2
(45) Date of Patent: Oct. 23, 2007

(54) INDIUM-TIN OXIDE (ITO) FILM AND PROCESS FOR ITS PRODUCTION

(75) Inventors: Andreas Klöppel, Glauburg (DE); Jutta Trube, Mombris (DE)

(73) Assignee: Unaxis Deutschland GmbH, Hanau (DE)

( * ) Notice: Subject to any disclaimer, the term of this patent is extended or adjusted under 35 U.S.C. 154(b) by 0 days.

(21) Appl. No.: 10/986,597

(22) Filed: Nov. 11, 2004

(65) Prior Publication Data

US 2005/0175862 A1 Aug. 11, 2005

Related U.S. Application Data

(62) Division of application No. 10/276,202, filed as application No. PCT/EP01/05060 on May 4, 2001, now Pat. No. 6,849,165.

(30) Foreign Application Priority Data

May 12, 2000 (DE) ................. 100 23 459

(51) Int. Cl.
*B32B 9/00* (2006.01)
(52) U.S. Cl. ............... 428/701; 428/702; 428/432
(58) Field of Classification Search ........... 428/697, 428/702, 689; 204/192.1, 192.29
See application file for complete search history.

(56) References Cited

U.S. PATENT DOCUMENTS 5,538,905 A * 7/1996 Nishioka et al. ............ 438/609

6,787,989 B2 * 9/2004 Wada et al. ................. 313/504

FOREIGN PATENT DOCUMENTS

| JP | 02054755 | 2/1990 |
|----|----------|--------|
| JP | 05239636 | 9/1993 |
| JP | 09293693 | 11/1997 |
| JP | 2000128698 A * | 5/2000 |

OTHER PUBLICATIONS

"Effect of Hydrogen Partial Pressure on Optoelectronic Properties of Indium Tin Oxide Thin Films Deposited by Radio Frequency Magnetron Sputtering Method" by K. Zhang et al., Journal of Applied Physics., vol. 86, No. 2, Jul. 15, 1999, pp. 974-980.
"Effect of Process Parameters on Characteristics of Indium Tin Oxide Thin Film for Flat Panel Display Application" by H.L. Byung et al. Thin Solid Films, Elsevier-Sequoia S.A., Lausanne, CH, vol. 302, No. 1-2, Jun. 20, 1997, pp. 25-30.

(Continued)

*Primary Examiner*—Jennifer McNeil
*Assistant Examiner*—Timothy M. Speer
(74) *Attorney, Agent, or Firm*—Sheridan Ross P.C.

(57) ABSTRACT

A process for the deposition of transparent and conductive indium-tin oxide (ITO) films with a particularly low resistance of preferably less than 200 μΩcm and a small surface roughness of preferably less than 1 nm on a substrate, wherein combined BF/DC sputtering of an indium-tin oxide (ITO) target is employed and wherein the process gas is supplemented by an argon/hydrogen mixture as reaction gas during the sputtering, as well as ITO-films with the above-named characteristics.

21 Claims, 2 Drawing Sheets

OTHER PUBLICATIONS

Figure 1:
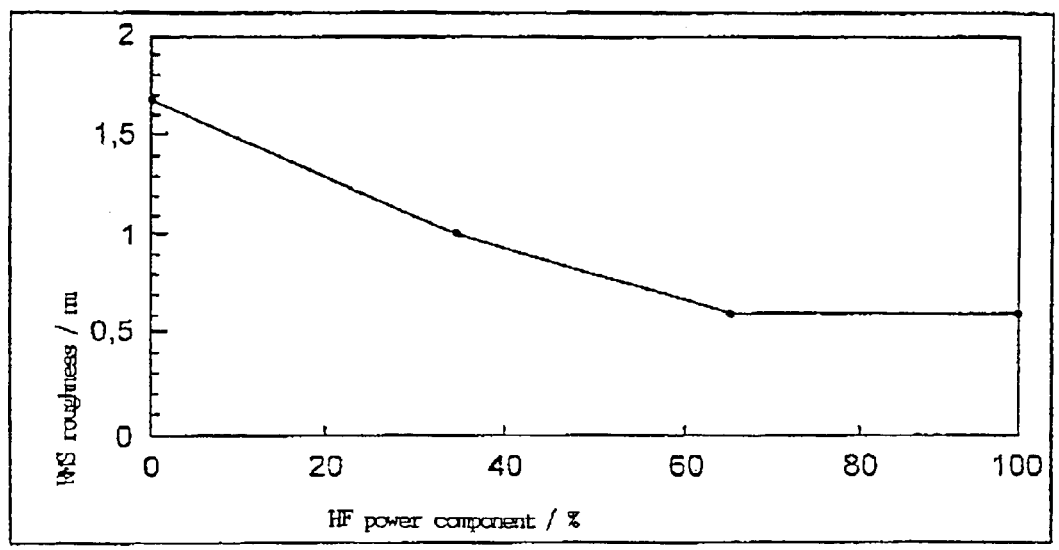

"Low Resistivity Indium-Tin Oxide Transparent Conductive Films. I. Effect of Introducing H2O Gas or H2 Gas During Direct Current Magnetron Sputtering" by S. Ishibashi et al., Journal of Vacuum Science and Technology: Part A, American Institute of Physics, vol. 8, No. 3, Part 1, May 1990, pp. 1399-1402.

"Indium Tin Oxide Films Prepared by Radio Frequency Magnetron Sputtering Method at a Low Processing Temperature" by K. Zhang et al., Thin Solid Films, Elsevier-Sequoia S.A., Lausanne, CH, vol. 376, No. 1-2, Nov. 1, 2000, pp. 255-263.

"DC Magnetron Reactively Sputtered Indium-Tin-Oxide Films Produced Using Argon-Oxygen-Hydrogen Mixtures" by G.L. Harding et al., Solar Energy Materials, Elsevier Science Publishers B.V., Amsterdam, NL, Nos. 5/6, pp. 367-379.

"Electrical Characterization of ITO/p-InP Solar Cells", by Z.A. Shi et al., 23$^{rd}$ IEEE Photovoltaic Specialists Conference, May 14, 1993, pp. 1432-1436.

"Optimized Indium Tin Oxide Contact for Organic Light Emitting Diode Applications" by F. Zhu et al., Thin solid Films, Elsevier-Sequoia S.A. Lausanne, CH, 2000, No. 1/2, pp. 314-317.

* cited by examiner

INDIUM-TIN OXIDE (ITO) FILM AND PROCESS FOR ITS PRODUCTION

CROSS-REFERENCE TO RELATED APPLICATIONS

This application is a divisional of U.S. patent application Ser. No. 10/276,202, filed May 1, 2003, which is the National Stage of International Application No. PCT/EP01/05060, filed May 4, 2001, which claims priority to German Patent Application 100 23 459.3, filed May 12, 2000, each of which is incorporated herein in its entirety.

The present invention concerns an indium-tin oxide (ITO) film for use as a transparent, conductive electrode, especially with organic LED displays, as well as a process for the deposition of transparent and conducting indium-tin oxide (ITO) films on a substrate. Transparent and conductive electrode films are needed for flat monitors and screens, as are used—for example—in portable computers or displays for mobile telephones, as—for example—liquid crystal displays, organic LED displays, TFT screens, etc. For this purpose it is a common practice to use indium-tin oxide films (ITO films), since they best satisfy the requirements as far conductivity and transmission properties are concerned. It is customary for these ITO films to be applied to transparent substrate materials, especially glass, transparent plastics, combined glass-plastic laminates, etc., by sputter deposition (cathode atomization) of an ITO target.

In "Low Resistivity Indium-Tin Oxide Transparent Conductive Films, I. Effect Of Introducing $H_2O$—Gas During Direct Current Magnetron Sputtering", J. Vac. Sci. Technol. A8(3) May/June 1990, Ishibashi et al. describe a direct current (DC) magnetron-sputter process in which the addition to the process gas of water vapour or hydrogen makes it possible to deposit an ITO film at a deposition temperature of less than 200° C., this film having a specific resistance of about $6 \times 10^{-4}$ $\Omega$cm, The low deposition temperature and/or substrate temperature of less than 200° C. is particularly important in this connection, because at higher deposition or substrate temperatures, even though the sputter process will lead more readily to the desired results, it could well damage both the deposited film and the substrate. This is particularly important, for example, when plastic substrates are used, polyethylene terephthalate (PET) being a case in point, which would be destroyed at higher temperatures.

Another process for the deposition of low-resistance ITO films is described by H. Lee et al. in "Effect Of Base Pressure in Sputter Deposition on Characteristics of Indium Tin Oxide Thin Film", Flat Panel Display Materials II, Symposium San Francisco, Calif., USA, 8 to 12 Apr. 1996, Mat. Res. Soc. Symp. Proc. Vol. 424, 1997. The process in question is a combined radio-frequency (RF) and DC-magnetron sputter process and is used to vaporize an ITO target with equal shares of DC sputtering and RF-sputtering and to deposit a film with a specific resistance of less than $1.5 \times 10^{-4}$ $\mu\Omega$m. The process gas used in this case was argon.

Although the films produced by means of the above processes are all characterized by a low specific resistance, they also have the drawback of being associated with a substantial surface roughness. In particular, the surface structure of such ITO films is characterized by a domain structure with grains of different crystal orientation within the domains, where individual grains have tips that project from the surface (so-called spikes). The rough surface and the so-called ITO spikes have the effect that when the ITO film is used as electrode, the spikes act as field peaks and will therefore reduce the useful life of, for example, organic LED cells when such ITO films are used with organic LED displays. Furthermore, the enhanced surface roughness leads to a reduced efficiency of such organic LED cells. Another disadvantage has to be seen in the fact that in the production of organic LED displays it is quite possible that the organic materials deposited on the ITO film will not cover the spikes, which may therefore create short circuits during subsequent use.

The present invention therefore sets out to make available ITO films and a process for the deposition of ITO films that will make it possible to produce ITO films with a small surface roughness, preferably less than 1 nm, and a low specific resistance, preferably less than 200 $\mu\Omega$cm, and where the deposition temperature and/or the temperature of the substrate on which the ITO films are to be deposited is to be low, especially less than 250° C., and preferably less than 200° C. In particular, it is proposed to provide a process and appropriate ITO films suitable for industrial use, i.e. capable of being realized in a simple manner and at a reasonable cost, that will especially avoid the so-called ITO spikes.

This task is absolved by means of the process in accordance with claim 1, and the ITO film in accordance with claim 7. Advantageous embodiments are described by the dependent claims.

The process for the deposition of transparent and conductive indium-tin oxide (ITO) films in accordance with the invention, which gives rise, in particular, to films with a low specific resistance and a very smooth surface, comprises a combined high-frequency/direct current (HF/DC) sputter process in art atmosphere that utilizes an argon/hydrogen mixture as reaction gas. When the HF power component used for the sputtering is in the high-frequency range, which is known to a person skilled in the art, the chosen reaction gas mixture of argon and hydrogen becomes activated in the HF plasma and this has positive effects on the deposited ITO film. In particular, both the surface roughness and the specific resistance of the film are clearly reduced, while the substrate temperature can be kept at a low value of less than 250° C., preferably $\leq$200° C. Due to their lesser surface roughness the use of films deposited in this manner for organic LED cells makes it possible to obtain a greater efficiency, a greater yield and a longer useful life for organic LED displays. Furthermore, the reduction of the specific resistance has the effect that a smaller film thickness may be chosen for certain applications in which the ITO film has to possess a predetermined resistance per unit area, so that the necessary film can be produced with a smaller quantity of indium-tin oxide material.

For the sputtering it is customary to use known ITO targets that preferably comprise 90% of indium oxide ($In_2O_3$) and 10% of tin oxide ($SnO_2$). The HF power component is preferably set to at least 30%, especially 60% and over, where preferred combinations will have an HF power component in the range between 40 and 90%, especially HF power components between 60 and 80%.

The argon-hydrogen mixture added to the process gas in accordance with the invention will preferably have a mixing ratio of 80% argon and 20% hydrogen. Advantageously, such an argon/hydrogen mixture is added to the process gas, which usually consists of argon, in the range between 0.1 and 30%, especially between 5 and 15%, but preferably between 8 and 10%.

For the deposition of ITO films the overall pressure of the process gas may also play an important part. Here it has been found that particularly good results are obtained when the total pressure is in the range between 0.5 and 5 μbar, preferably between 1 and 3 μbar and even more preferably between 1.5 and 2 μbar.

In a preferred embodiment, to be chosen particularly when ITO films are deposited on plastic materials, the substrate temperature during the deposition of the ITO film is set to not more than 250° C., preferably ≦200° C. This has the advantage that neither the substrate nor the film itself will be damaged due to an excessive temperature.

Although the described process is not limited to the use of magnetron sputter plants, the sputter deposition will preferably be supported by an appropriate magnetron arrangement.

The ITO films in accordance with the invention, especially those produced by means of the process described above, have a smooth surface with a surface roughness of less than 1 nm and a specific resistance that amounts to less than 200 μΩcm, especially a resistance in the range between 140 and 160 μΩcm.

Further advantages, features and characteristics of the invention will be brought out by the detailed description about to be given of some preferred embodiments. To this end the diagramme reproduced in FIG. 1 illustrates the dependency of the surface roughness (RMS roughness) of ITO films on the HF component during deposition with a power density of $P=2$ W/cm$^2$ and a substrate temperature of $T_{sub}=200°$ C., and the diagramme of FIG. 2 illustrates the dependency of the specific resistance ρ of ITO films on the HF component during deposition with a power density of $P=2$ W/cm$^2$ and a substrate temperature of $T_{sub}=200°$ C., while FIG. 3 shows raster scan microscope (AFM) photographs at a magnification of 60,000× of ITO films that were deposited with different HF power components at a substrate temperature of $T_{sub}=200°$ C.

a: exclusively DC sputtering,
b: 33% HF component during HF/DC sputtering,
c: 66% HF component during HF/DC sputtering, and
d: exclusively HF sputtering.

FIG. 1 illustrates the dependency of the surface roughness on the HF power component during ITO film deposition in accordance with the invention. As the HF component of the combined HF/DC sputtering increases, the surface of the film becomes increasingly smooth. Especially as from an HF component of about 30% onwards, one can note a significant reduction of the surface roughness. As from an HF component of about 65% onwards, however, a saturation effect makes itself felt as regards this influence on the surface roughness.

Figure 2:
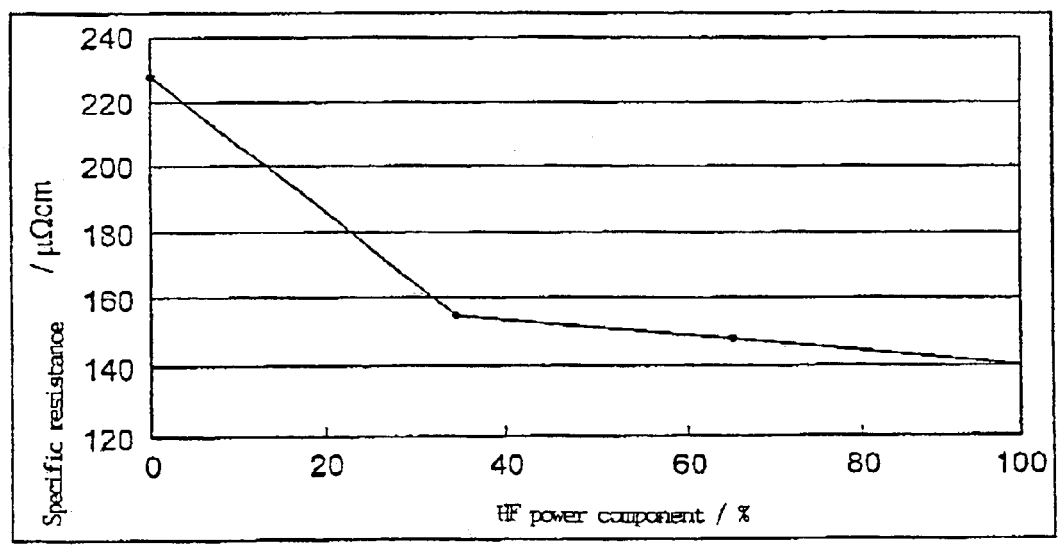
Figure 3:
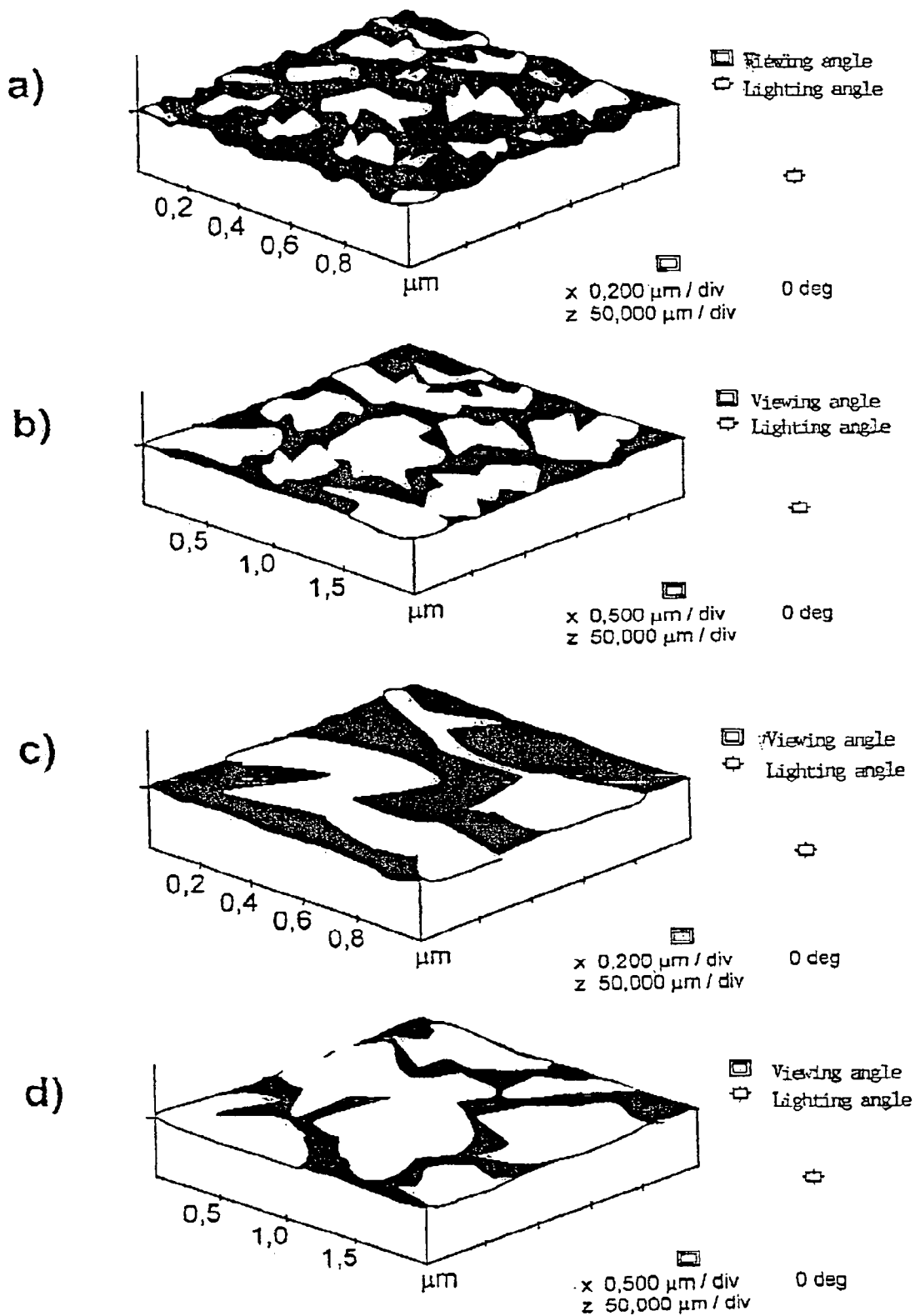

FIG. 2 illustrates the dependency of the specific resistance ρ of ITO films that were deposited with increasing HF power components. Here one can note once again that the specific resistance diminishes as the HF power component increases. A particularly clear reduction can be noted up to an HF component of about 30%, but from that point onwards any further increase of the HF component produces only a slight but continuous reduction of the specific resistance.

FIG. 3 illustrates the influence of the HF power component during combined HF/DC sputtering on the surfaces of ITO films that were deposited at substrate temperatures of 200° C. At a magnification of 60,000×, the various AFM photographs of FIG. 3 show ITO films that were deposited exclusively by means of DC sputtering (a), by means of combined HF/DC sputtering with an HF component of 33% (b) and with an HF component of 66% (c), and exclusively by means of HF sputtering (d). The AFM photographs clearly show that a clearly smoother surface structure can be obtained as the HF power component increases, and that the surface roughness attains an optimum at an HF component of 66%.

In a preferred embodiment an ITO film in accordance with the invention was deposited on float glass with the following parameters:
Target: ITO-Mitsui (90% indium oxide/10% tin oxide)
Purity: 4N$_2$ density>98%
Total sputtering power: 860 W (570 W HF/290 W DC)
HF power component: 66%
Process pressure: 1.5 μmbar, argon/hydrogen share (80%/20% mixture): 8%
Deposition temperature: 200° C.
Magnetic field strength: 1200 G
Substrate: Float glass
Film thickness: 72 nm In the case of an ITO film deposited with the above parameters by means of magnetron sputtering the RMS roughness as ascertained by means of AFM (raster screen microscope) was found to be 0.623 nm. The RMS (root mean square roughness) is defined as the standard deviation of the values of z (film thickness) determined by measurement with the raster screen microscope. The specific resistance of the film amounted to 152 μΩcm. The trans-mission at a wave length of 550 um amounted to 81% of the reference medium air.

These result show that the process described above makes it possible to produce ITO films in accordance with the invention that, especially as gar as surface roughness and specific resistance are concerned, have excellent properties for use in organic LED displays.

The invention claimed is:

1. A single layer indium-tin oxide (ITO) film for use as a transparent and conductive electrode on a substrate, comprising:
a single layer ITO film wherein the single layer has both;
a) a specific resistance of less than 200 μΩcm and
b) a surface roughness of less than 1 nm.

2. An ITO film in accordance with claim 1, wherein the specific resistance ranges from 120 to 180 μΩcm.

3. A single layer indium-tin oxide (ITO) film made by the process comprising combined HF/DC sputtering of an ITO target to deposit a single layer of an ITO film onto a substrate, wherein a process gas is supplemented by an argon/hydrogen mixture as reaction gas during the sputtering and wherein the ITO film has a resistance of less than 200 μΩcm and a surface roughness of less than 1 nm.

4. An ITO film of claim 3, wherein the resistance of the film is between 120 μΩcm and 180 μΩcm.

5. An ITO film of claim 3, wherein at least 30% of total power for the HF/DC sputtering is HF power.

6. An ITO film of claim 3, wherein at least 60% of total power for the HF/DC sputtering is HF power.

7. An ITO film of claim 3, wherein HF power comprises 40% to 90% of total power for the HF/DC sputtering.

8. An ITO film of claim 3, wherein HF power comprises 60% to 80% of total power for the HF/DC sputtering.

9. An ITO film of claim 3, wherein the argon/hydrogen mixture comprises an argon:hydrogen ratio of 80:20.

10. An ITO film of claim 3, wherein the argon/hydrogen mixture constitutes between 0.1% and 30% of the process gas.

11. An ITO film of claim 3, wherein the argon/hydrogen mixture comprises an argon:hydrogen ratio of 80:20 and the argon/hydrogen mixture constitutes between 0.1% and 30% of the process gas.

12. An ITO film of claim 3, wherein the argon/hydrogen mixture comprises an argon:hydrogen ratio of 80:20 and the argon/hydrogen mixture constitutes between 5% and 15% of the process gas.

13. An ITO film of claim 3, wherein the argon/hydrogen mixture comprises an argon:hydrogen ratio of 80:20 and the argon/hydrogen mixture constitutes between 8% and 10% of the process gas.

14. An ITO film of claim 3, wherein pressure of the process gas during sputtering is between 0.5 μmbar and 5 μmbar.

15. An ITO film of claim 3, wherein pressure of the process gas during sputtering is between 1.5 μmbar and 3 μmbar.

16. An ITO film of claim 3, wherein temperature of the substrate during deposition of the ITO film does not exceed 250° C.

17. An ITO film of claim 3, wherein temperature of the substrate during deposition of the ITO film does not exceed 200° C.

18. An ITO film of claim 3, wherein the HF/DC sputtering is magnetron sputtering.

19. An organic LED display having a transparent and conductive electrode comprising an ITO film of claim 3.

20. A single layer indium-tin oxide (ITO) film made by the process comprising combined HF/DC sputtering of a single layer of an ITO target to deposit an ITO film onto a substrate, wherein a process gas is supplemented by an 80:20 argon:hydrogen reaction gas mixture during the sputtering, wherein the reaction gas mixture constitutes between 0.1% and 30% of the process gas, and wherein the ITO film has a resistance of less than 200 μcm and a surface roughness of less than 1 nm.

21. A single layer indium-tin oxide (ITO) film, wherein the single layer has both a specific resistance of less than 200 μΩcm and a surface roughness of less than 1 nm, made by the process comprising combined HF/DC sputtering of a single layer of an ITO target to deposit an ITO film onto a substrate, wherein a process gas, having a pressure of between 0.5 μmbar and 5 μmbar, is supplemented by an argon/hydrogen mixture as reaction gas during the sputtering and wherein the substrate temperature does not exceed 250° C. during the deposition of the ITO film.

* * * * *